United States Patent
Li et al.

(10) Patent No.: US 12,317,635 B2
(45) Date of Patent: *May 27, 2025

(54) SOLAR CELL AND PHOTOVOLTAIC MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Wenqi Li, Zhejiang (CN); Ding Yu, Zhejiang (CN); Jie Yang, Zhejiang (CN); Xinyu Zhang, Zhejiang (CN); Hao Jin, Zhejiang (CN)

(73) Assignees: Jinko Green Energy (Shanghai) Management Co., LTD., Shanghai (CN); Zhejiang Jinko Solar Co., Ltd., Haining (CN)

( * ) Notice: Subject to any disclaimer, the term of this patent is extended or adjusted under 35 U.S.C. 154(b) by 170 days.

This patent is subject to a terminal disclaimer.

(21) Appl. No.: 18/295,210

(22) Filed: Apr. 3, 2023

(65) Prior Publication Data
US 2023/0253514 A1 Aug. 10, 2023

Related U.S. Application Data

(63) Continuation of application No. 17/483,712, filed on Sep. 23, 2021, now Pat. No. 11,664,467.

(30) Foreign Application Priority Data

Aug. 20, 2021 (CN) .......................... 202110963291.4

(51) Int. Cl.
*H10F 77/30* (2025.01)
*H10F 19/80* (2025.01)
(Continued)

(52) U.S. Cl.
CPC ............ *H10F 77/311* (2025.01); *H10F 19/80* (2025.01); *H10F 19/902* (2025.01); *H10F 77/707* (2025.01)

(58) Field of Classification Search
CPC ......... H01L 31/02167; H01L 31/02366; H01L 31/048; H01L 31/0504; H10F 77/311; H10F 77/707; H10F 19/902; H10F 19/80
See application file for complete search history.

(56) References Cited

U.S. PATENT DOCUMENTS 10,991,838 B1   4/2021 Yang et al.
2004/0075908 A1 * 4/2004 Chen ................... G02B 5/0833
                                                          359/585

(Continued)

FOREIGN PATENT DOCUMENTS

CN      103413840 A    11/2013
CN      203325916 U    12/2013
(Continued)

OTHER PUBLICATIONS

Nguyen (Year: 2017).*
(Continued)

*Primary Examiner* — Sadie White
(74) *Attorney, Agent, or Firm* — USCH Law, PC (57) ABSTRACT

A solar cell and a photovoltaic module including the same are provided. The solar cell includes a substrate having a first surface and a second surface opposite to each other; a first passivation stack disposed on the first surface and including a first oxygen-rich dielectric layer, a first silicon-rich dielectric layer, a second oxygen-rich dielectric layer, and a second silicon-rich dielectric layer that are sequentially disposed in a direction away from the first surface, wherein an atomic fraction of oxygen in the first oxygen-rich dielectric layer is less than an atomic fraction of oxygen in the second oxygen-rich dielectric layer; a tunneling oxide layer disposed on the (Continued)

second surface; a doped conductive layer disposed on a surface of the tunneling oxide layer; and a second passivation layer disposed on a surface of the doped conductive layer.

20 Claims, 4 Drawing Sheets

(51) Int. Cl.
*H10F 19/90* (2025.01)
*H10F 77/70* (2025.01)

(56) References Cited

U.S. PATENT DOCUMENTS

| | | | | |
|---|---|---|---|---|
| 2007/0186970 | A1* | 8/2007 | Takahashi | H01L 31/1804 136/255 |
| 2011/0094575 | A1* | 4/2011 | Phan | H01L 31/1868 136/256 |
| 2011/0094586 | A1* | 4/2011 | Cheong | H01L 31/02168 257/E31.127 |
| 2011/0162706 | A1* | 7/2011 | Borden | H01L 31/03682 257/E31.119 |
| 2011/0194181 | A1* | 8/2011 | Takahashi | G02B 1/113 359/585 |
| 2013/0056053 | A1* | 3/2013 | Lochtefeld | H01L 31/0735 257/E31.124 |
| 2013/0130430 | A1* | 5/2013 | Moslehi | H01L 31/0682 438/89 |
| 2015/0179837 | A1* | 6/2015 | Cheong | H01L 31/0201 136/255 |
| 2016/0380124 | A1* | 12/2016 | Johnson | H01L 31/02167 136/258 |
| 2017/0005218 | A1* | 1/2017 | Chang | H01L 31/022425 |
| 2017/0069778 | A1* | 3/2017 | Kwon | H01L 31/02245 |
| 2020/0343391 | A1 | 10/2020 | Choi et al. | |
| 2022/0271179 | A1 | 8/2022 | Li et al. | |

FOREIGN PATENT DOCUMENTS

| | | |
|---|---|---|
| CN | 107068774 A | 8/2017 |
| CN | 108962999 A | 12/2018 |
| CN | 109004038 A | 12/2018 |
| CN | 109216473 A | 1/2019 |
| CN | 109935647 A | 6/2019 |
| CN | 110061072 A | 7/2019 |
| CN | 110896118 A | 3/2020 |
| CN | 111668318 A | 9/2020 |
| CN | 112201701 A | 1/2021 |
| CN | 112259615 A | 1/2021 |
| CN | 112531035 A | 3/2021 |
| CN | 112838132 A | 5/2021 |
| JP | 5019397 B2 | 9/2012 |
| JP | 2013065833 A | 4/2013 |
| JP | 2015122435 A | 7/2015 |
| JP | 6916972 B1 | 8/2021 |
| WO | 2017057618 A1 | 4/2017 |

OTHER PUBLICATIONS

Tsubata Ryohei, et al., "Realization of the Crystalline Silicon Solar Cell Using Nanocrystalline Transport Path in Ultra-thin Dielectrics for Reinforced Passivating Contact", 2021 IEEE 48th Photovoltaic Specialists Conference (PVSC), Jun. 20, 2021, 4 pgs.

Wang Puqun, et al., "Investigating Industrial Metallization Solutions for Double-side Contact Passivated biPoly Solar Cells", 2019 IEEE 46th Photovoltaic Specialists Conference (PVSC), Jun. 16, 2019, 5 pgs.

Huong Thi Thanh Nguyen, et al., "Al2O3/SiON stack layers for effective surface passivation and anti-reflection of high efficiency n-type c-Si solar cells", Semiconductor Science Technology, Jan. 9, 2017, 8 pgs.

Shanghai Jinko Green Energy Enterprise Management Co., Ltd., et al., the Second Non-Final Rejection, U.S. Appl. No. 17/483,712, Jan. 13, 2023, 31 pgs.

Shanghai Jinko Green Energy Enterprise Management Co., Ltd., et al., Extended European Search Report, EP 21197431.6, Mar. 10, 2022, 31 pgs.

Shanghai Jinko Green Energy Enterprise Management Co., Ltd. et al., JP First Office Action with English translation, JP 2021-152725, Nov. 26, 2021, 6 pgs.

Shanghai Jinko Green Energy Enterprise Management Co., Ltd. et al., JP First Office Action with English translation, JP 2022-078217, Jun. 2, 2022, 4 pgs.

Shanghai Jinko Green Energy Enterprise Management Co., Ltd., et al., AU First Office Action, AU 2022204453, Jun. 21, 2023, 4 pgs.

Shanghai Jinko Green Energy Enterprise Management Co., Ltd., et al., AU Second Office Action, AU 2022204453, Aug. 9, 2023, 3 pgs.

Shanghai Jinko Green Energy Enterprise Management Co., Ltd., et al., Extended European Search Report, EP 23176118.0, Jun. 12, 2023, 13 pgs.

* cited by examiner

FIG. 10

SOLAR CELL AND PHOTOVOLTAIC MODULE

CROSS-REFERENCE TO RELATED APPLICATION

The application is a continuation of U.S. patent application Ser. No. 17/483,712, filed on Sep. 23, 2021, which claims priority to Chinese Patent Application No. 202110963291.4, filed on Aug. 20, 2021, the content of each of which is incorporated herein by reference in its entirety.

TECHNICAL FIELD

Embodiments of the present disclosure relate to the photovoltaic field, in particular to a solar cell and a photovoltaic module.

BACKGROUND

Potential induced degradation (PID) refers to a phenomenon of power degradation of photovoltaic module under a long-term action of external voltage. At present, PID-s and PID-p theory are generally employed for the failure mechanism of PID. According to the PID-s theory, ethylene-vinyl acetate (EVA) in package material is hydrolyzed by reacting with water vapor to produce acetic acid which then reacts with a glass surface to produce free sodium ions Na+, and under action of electric field, the sodium ions Na+ penetrate through a passivation layer and enter a PN junction, so that a leakage path is formed. According to the PID-p theory, carrier recombination is caused by the sodium ions Na+ attracting minority carriers on the back.

SUMMARY

In one aspect, embodiments of the present disclosure provide a solar cell including a substrate, a first passivation stack, a tunneling oxide layer, a doped conductive layer and a second passivation layer. The substrate has a first surface and a second surface opposite to each other. The first passivation stack is disposed on the first surface and includes a first oxygen-rich dielectric layer, a first silicon-rich dielectric layer, a second oxygen-rich dielectric layer, and a second silicon-rich dielectric layer that are sequentially disposed in a direction away from the first surface. An atomic fraction of oxygen in the first oxygen-rich dielectric layer is less than an atomic fraction of oxygen in the second oxygen-rich dielectric layer. The tunneling oxide layer is disposed on the second surface. The doped conductive layer is disposed on a surface of the tunneling oxide layer. The second passivation layer is disposed on a surface of the doped conductive layer.

In an embodiment, both the first silicon-rich dielectric layer and the second silicon-rich dielectric layer includes oxygen atoms, the atomic fraction of oxygen in the first oxygen-rich dielectric layer is in a range of 40% to 70%, the first silicon-rich dielectric layer includes oxygen atoms and an atomic fraction of oxygen in the first silicon-rich dielectric layer is greater than 0% and less than or equal to 10%, the atomic fraction of oxygen in the second oxygen-rich dielectric layer is in a range of 30% to 80%, and the second silicon-rich dielectric layer includes oxygen atoms and an atomic fraction of oxygen in the second silicon-rich dielectric layer is greater than 0% and less than or equal to 10%.

In an embodiment, the atomic fraction of oxygen in the first oxygen-rich dielectric layer is in a range of 40% to 60%, the atomic fraction of oxygen in the first silicon-rich dielectric layer is greater than 0% and less than or equal to 7%, the atomic fraction of oxygen in the second oxygen-rich dielectric layer is in a range of 50% to 80%, and the atomic fraction of oxygen in the second silicon-rich dielectric layer is greater than 0% and less than or equal to 7%.

In an embodiment, a material of the first oxygen-rich dielectric layer includes at least one and aluminum oxide, silicon oxide, silicon oxynitride, gallium oxide, titanium oxide, or hafnium oxide.

In an embodiment, the first oxygen-rich dielectric layer includes an aluminum oxide layer and a silicon oxynitride layer, and the aluminum oxide layer is positioned between the silicon oxynitride layer and the substrate.

In an embodiment, a ratio of the number of oxygen atoms to the number of aluminum atoms in the aluminum oxide is in a range of 0.6 to 2.4.

In an embodiment, a refractive index of the first oxygen-rich dielectric layer is higher than a refractive index of the second oxygen-rich dielectric layer.

In an embodiment, the first oxygen-rich dielectric layer includes a silicon oxide material, a refractive index of the first oxygen-rich dielectric layer is in a range of 1.58 to 1.61, and a thickness of the first oxygen-rich dielectric layer in a direction perpendicular to the first surface is in a range of 2 nm to 15 nm.

In an embodiment, the first oxygen-rich dielectric layer includes a silicon oxynitride material, a refractive index of the first oxygen-rich dielectric layer is in a range of 1.61 to 1.71, and a thickness of the first oxygen-rich dielectric layer in a direction perpendicular to the first surface is in a range of 8 nm to 20 nm.

In an embodiment, the first oxygen-rich dielectric layer includes an aluminum oxide material, a refractive index of the first oxygen-rich dielectric layer is in a range of 1.71 to 1.81, and a thickness of the first oxygen-rich dielectric layer in a direction perpendicular to the first surface is in a range of 1 nm to 20 nm.

In an embodiment, the second oxygen-rich dielectric layer includes a silicon oxynitride material, a refractive index of the second oxygen-rich dielectric layer is in a range of 1.56 to 1.62, and a thickness of the second oxygen-rich dielectric layer in a direction perpendicular to the first surface is in a range of 5 nm to 20 nm.

In an embodiment, a refractive index of the first silicon-rich dielectric layer is higher than a refractive index of the second silicon-rich dielectric layer.

In an embodiment, the refractive index of the first silicon-rich dielectric layer is in a range of 2.02 to 2.2, and the refractive index of the second silicon-rich dielectric layer is in a range of 1.98 to 2.06.

In an embodiment, a material of the first silicon-rich dielectric layer includes a first silicon nitride material, and a ratio of the number of silicon atoms to the number of nitrogen atoms in the first silicon nitride material is in a range of 0.66 to 2.3.

In an embodiment, a refractive index of the first silicon-rich dielectric layer is in a range of 2.02 to 2.2, and a thickness of the first silicon-rich dielectric layer in a direction perpendicular to the first surface is in a range of 20 nm to 50 nm.

In an embodiment, a material of the second silicon-rich dielectric layer includes a second silicon nitride material, and a ratio of the number of silicon atoms to the number of nitrogen atoms in the second silicon nitride material is in a range of 0.46 to 1.87.

In an embodiment, a refractive index of the second silicon-rich dielectric layer is in a range of 1.98 to 2.06, and a thickness of the second silicon-rich dielectric layer in a direction perpendicular to the first surface is in a range of 20 nm to 50 nm.

In an embodiment, a refractive index of the second passivation layer is in a range of 2.04 to 2.2, and a thickness of the second passivation layer in a direction perpendicular to the second surface is in a range of 60 nm to 100 nm.

In another aspect, embodiments of the present disclosure provide a photovoltaic module including a cell string, a package adhesive film and a cover plate. The cell string includes a plurality of solar cells connected with each other. The package adhesive film is configured to cover a surface of the cell string. The cover plate is configured to cover a surface of the package adhesive film facing away from the cell string. Each of the plurality of solar cells includes a substrate, a first passivation stack, a tunneling oxide layer, a doped conductive layer and a second passivation layer. The substrate has a first surface and a second surface opposite to each other. The first passivation stack is disposed on the first surface and includes a first oxygen-rich dielectric layer, a first silicon-rich dielectric layer, a second oxygen-rich dielectric layer, and a second silicon-rich dielectric layer that are sequentially disposed in a direction away from the first surface. An atomic fraction of oxygen in the first oxygen-rich dielectric layer is less than an atomic fraction of oxygen in the second oxygen-rich dielectric layer. The tunneling oxide layer is disposed on the second surface. The doped conductive layer is disposed on a surface of the tunneling oxide layer. The second passivation layer is disposed on a surface of the doped conductive layer.

In an embodiment, the photovoltaic module further includes an edge sealing member fixedly packaging at least the sides of the photovoltaic module.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

The embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
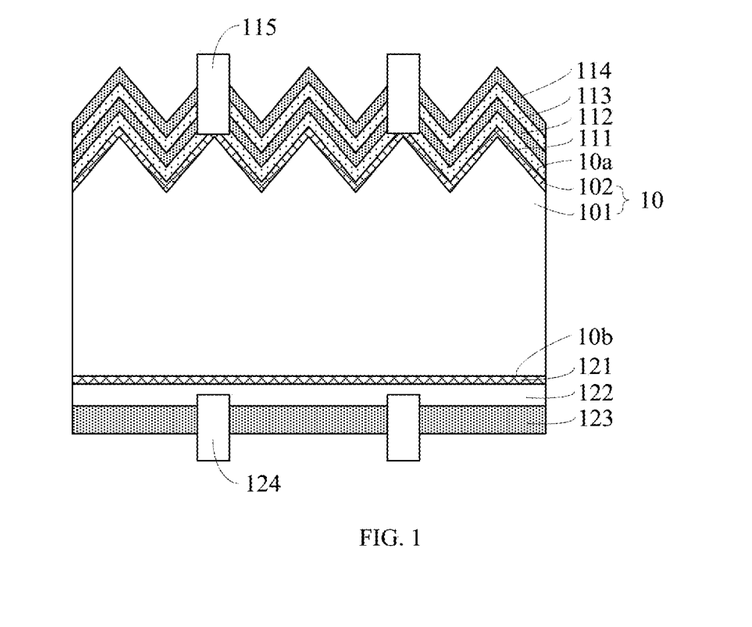
FIG. 1 is a schematic cross-sectional view of a solar cell according to an embodiment of the present disclosure.
Figure 2:
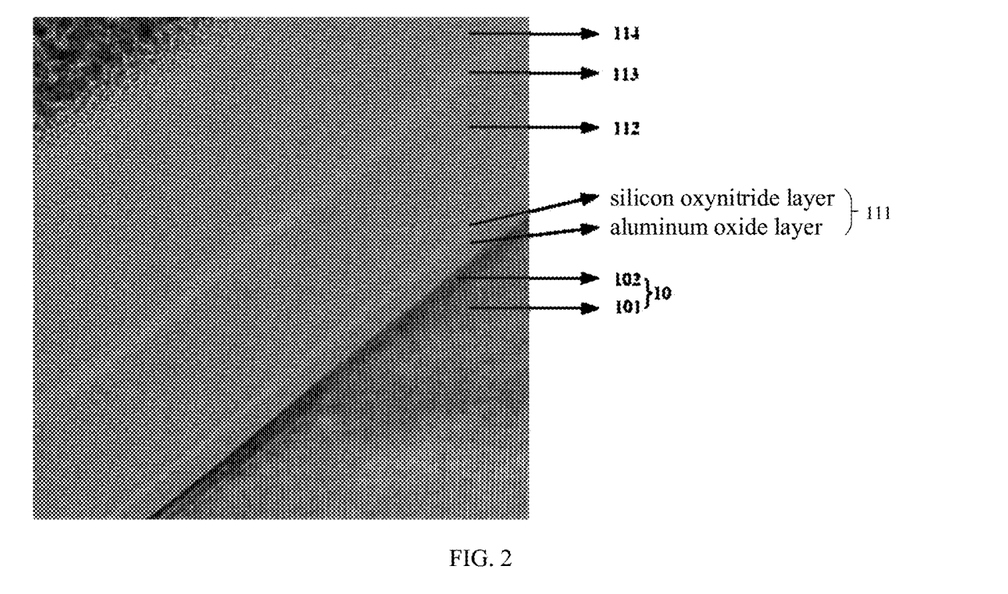
FIG. 2 is a partial sectional view of a solar cell according to an embodiment of the present disclosure.
Figure 3:
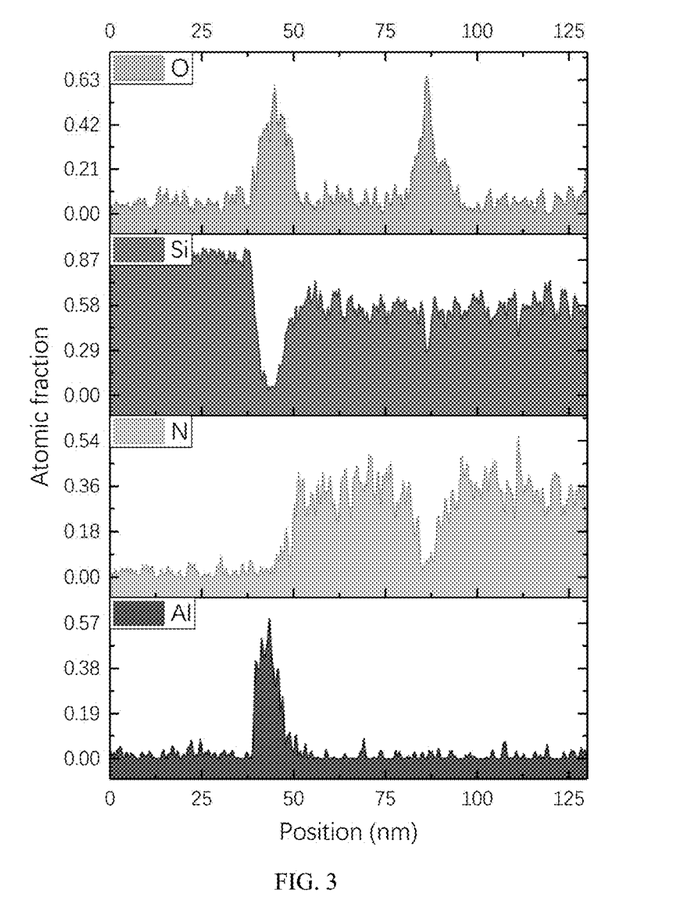
FIG. 3 is a schematic diagram showing atomic fraction of various atoms in different positions of a solar cell according to an embodiment of the present disclosure.

The embodiments of the present disclosure provide a solar cell and a photovoltaic module. The solar cell provided in the embodiments of the present disclosure will be described in detail below with reference to the accompanying drawings. FIG. 1 is a schematic cross-sectional view of a solar cell according to an embodiment of the present disclosure. FIG. 2 is a partial sectional view of a solar cell according to an embodiment of the present disclosure. FIG. 3 is a schematic diagram showing fraction of various atoms in different positions of a solar cell according to an embodiment of the present disclosure.

Referring to FIG. 1, the solar cell includes a substrate 10, a first passivation stack, a tunneling oxide layer 121, a doped conductive layer 122 and a second passivation layer 123. The substrate 10 has two opposite surfaces, i.e., a first surface 10a and a second surface 10b. The first passivation stack is disposed on the first surface 10a. The first passivation stack includes a first oxygen-rich dielectric layer 111, a first silicon-rich dielectric layer 112, a second oxygen-rich dielectric layer 113, and a second silicon-rich dielectric layer 114 that are sequentially disposed in a direction away from the first surface 10a. An atomic fraction of oxygen in the first oxygen-rich dielectric layer 111 is less than that in the second oxygen-rich dielectric layer 113. The tunneling oxide layer 121 is disposed on the second surface 10b. The doped conductive layer 122 disposed on a surface of the tunneling oxide layer 121. The second passivation layer 123 is disposed on a surface of the doped conductive layer 122.

It should be noted that the oxygen-rich dielectric layer is a relative concept to which an oxygen-deficient dielectric layer is opposite, and the silicon-rich dielectric layer is a relative concept to which a silicon-deficient dielectric layer is opposite. In a local environment, a dielectric layer of a relatively large atomic fraction of oxygen may be referred to as the oxygen-rich dielectric layer, a dielectric layer of a relatively small atomic fraction of oxygen or an oxygen-free dielectric layer may be referred to as the oxygen-deficient dielectric layer. Similarly, a dielectric layer of a relatively large atomic fraction of silicon may be referred to as the silicon-rich dielectric layer, a dielectric layer of a relatively small atomic fraction of silicon or a silicon-free dielectric layer may be referred to as the silicon-deficient dielectric layer. A numerical value of the atomic fraction of oxygen in the oxygen-rich dielectric layer and a numerical value of the atomic fraction of silicon in the silicon-rich dielectric layer are not limited herein.

Compared with the silicon-rich dielectric layer, the oxygen-rich dielectric layer may be of higher density, weaker positive electricity and lower hardness, which contribute to preventing external ions from diffusing into the substrate and to reducing stress damage on the substrate, or may be of stronger negative electricity, which contributes to forming field passivation on the substrate and realizing selective transmission of carriers. At least two oxygen-rich dielectric layers are provided, which may strengthen any one of the aforementioned effects or make the solar cell have both effects. In addition, compared with the oxygen-rich dielectric layer, the silicon-rich dielectric layer generally has a higher refractive index. The two silicon-rich dielectric layers are spaced from each other, which is advantageous for causing two gradients of refractive index, that is, a first gradient of refractive index caused by the second silicon-rich dielectric layer and an external film layer (for example, a package film layer and a cover plate), and a second gradient of refractive index caused by the first silicon-rich dielectric layer and the second oxygen-rich dielectric layer, so that light of different wavelengths can effectively enter into the substrate, which is advantageous for improving the absorption efficiency of the solar cell.

Further, the atomic fraction of oxygen in the first oxygen-rich dielectric layer 111 is less than that in the second oxygen-rich dielectric layer 113. Since the larger the atomic fraction of oxygen, the stronger the compactness of the corresponding layer, and the better the barrier performance to the external ions or other impurities, the second oxygen-rich dielectric layer 113 of larger atomic fraction of oxygen contributes to blocking the external ions or other impurities in the outer layer, avoiding influence on antireflection performance of the first silicon-rich dielectric layer 112, and ensuring a higher efficiency for light absorption of the solar cell.

The solar cell shown in FIG. 1 will be described in more detail below with reference to the accompanying drawings.

In some embodiments, the substrate 10 is made from silicon-based material, such as one or more of monocrystalline silicon, polysilicon, amorphous silicon, or microcrystalline silicon. In other embodiments, the substrate may be made from material, such as carbon in simple substance, organic material, or multinary-compound, and the multinary-compound may include, but are not limited to, perovskite, gallium arsenide, cadmium telluride, copper indium selenium, and the like.

In some embodiments, the first surface 10a is a light receiving surface, the second surface 10b is a rear surface opposite to the light receiving surface. The first surface 10a may be a pyramid-textured surface to reduce light reflection on the first surface 10a, increase light absorption and utilization, and improve conversion efficiency of the solar cell. In some embodiments, the second surface 10b may also function as a light receiving surface when the solar cell is a double-sided cell.

The substrate 10 includes a base region 101 and an emitter 102. In some embodiments, the solar cell is an N-type cell, such as a TOPCon (Tunnel Oxide Passivated Contact) cell, in which the base region 101 includes an N-type doped element (e.g., phosphorus, arsenic, antimony, etc.), the emitter 102 includes a P-type doped element, the emitter 102 and the base region 101 form a PN junction, and the first oxygen-rich dielectric layer 111 covers the first surface 10a. In other embodiments, the solar cell is a P-type cell, such as a PERC (Passivated Emitter and Rear Cell), in which the base region includes a P-type doped element (e.g., boron, indium, etc.), the emitter includes an N-type doped element, the emitter and the base region form a PN junction, and the first oxygen-rich dielectric layer covers the second surface. The solar cell is described in detail below by taking the TOPCon cell as an example.

In some embodiments, the material of the first oxygen-rich dielectric layer 111 includes at least one of aluminum oxide, silicon oxide, silicon oxynitride, gallium oxide, titanium oxide, and hafnium oxide. Since the first oxygen-rich dielectric layer 111 may include materials of different electrical properties with different functions, the functions of the first oxygen-rich dielectric layer 111 may be discussed based on different material compositions, as follows:

In some embodiments, the first oxygen-rich dielectric layer 111 is of negative electricity, and the first oxygen-rich dielectric layer 111 includes at least one of aluminum oxide, gallium oxide, titanium oxide, and hafnium oxide, so as to form field passivation on the substrate 10, facilitate selective transmission of carriers, reduce carrier recombination, and improve photoelectric conversion efficiency. On this basis, the atomic fraction of oxygen in the first oxygen-rich dielectric layer 111 may be in a range of 40% to 70%, for example, 45%, 50%, 55%, 60%, or 65%. When the atomic fraction of oxygen is too low, the first oxygen-rich dielectric layer 111 is of weaker negative electricity and higher hardness. The weaker negative electricity is disadvantageous for dangling bonds at the saturation interface and to suppression of carrier recombination, and the higher hardness is disadvantageous for reduction of the stress damage between the substrate 10 and the first oxygen-rich dielectric layer 111. When the atomic fraction of oxygen is too high, the first oxygen-rich dielectric layer 111 is of stronger negative electricity, which prevents migration and permeation of external positive ions into the substrate. As an example, the atomic fraction of oxygen in the first oxygen-rich dielectric layer 111 may be in a range of 40% to 60%.

When the edge of the photovoltaic module gets damp, the EVA material in the package material is hydrolyzed by reacting with water vapor to produce acetic acid, and the acetic acid reacts with the cover glass to produce free sodium ions Na+. Under action of electric field, the sodium ions Na+ pass through the passivation layer and destroys the PN junction to form a leakage path. When being made from a material of negative electricity, such as aluminum oxide, the first oxygen-rich dielectric layer 111 carries charges whose polarity is opposite to that of the sodium ions Na+, so that it is impossible to prevent permeation and migration of the sodium ions Na+ by polarity repulsion, and the sodium ions Na+ may even be attracted to move toward the substrate, which are disadvantageous for protecting the PN junction. By controlling the negative electricity of the first oxygen-rich dielectric layer 111 within a certain range with reasonable composition of the first oxygen-rich dielectric layer 111, it is advantageous for suppression of an attractive force applied by the first oxygen-rich dielectric layer 111 to the sodium ions Na+, so as to improve the electrical property of the PN junction.

In some embodiments, the material of the first oxygen-rich dielectric layer 111 includes at least one of silicon oxide and silicon oxynitride. If the base region 101 includes mainly a semiconductor element, such as a silicon element, the first oxygen-rich dielectric layer 111 includes elements having properties similar to that of the substrate 10, and the material property of the first oxygen-rich dielectric layer 111 are similar to the material property of the substrate 10. As a result, stress damage and interface defects caused by difference in material property between the first oxygen-rich dielectric layer 111 and the substrate 10 are reduced, and the transmission efficiency of photogenerated carriers is improved.

In addition, the first oxygen-rich dielectric layer 111 is of positive electricity and high density when being mainly made from at least one of silicon oxide and silicon oxynitride, both of which are generally of positive electricity and high density, thereby preventing penetration of the sodium ions Na+. On this basis, the atomic fraction of oxygen in the first oxygen-rich dielectric layer 111 may be in a range of 40% to 70%, for example, 45%, 50%, 55%, 60%, or 65%. When the atomic fraction of oxygen is too low, the first oxygen-rich dielectric layer 111 is of stronger positive electricity, and majority carriers may fill holes in the first oxygen-rich dielectric layer 111 or react with doped hydrogen ions, which is disadvantageous for suppression of carrier recombination. When atomic fraction of oxygen is too high, the first oxygen-rich dielectric layer 111 is of low refractive index, which may enhance reflection and emission of the incident light and thus is disadvantageous for improving the light absorption efficiency.

In some embodiments, the first oxygen-rich dielectric layer 111 includes both a material of positive electricity (e.g., silicon oxide) and a material of negative electricity (e.g., aluminum oxide), and the atomic fraction of oxygen in the first oxygen-rich dielectric layer 111 is in a range of 40% to 70%, for example, 45%, 50%, 55%, 60%, or 65%, such that the first oxygen-rich dielectric layer 111 has both advantages of the two materials, that is, the first oxygen-rich dielectric layer 111 is of negative electricity, can form field passivation on the substrate 111 and achieve selective transmission of carriers; and meanwhile, the first oxygen-rich dielectric layer 111 is of high density, which is advantageous for preventing penetration of sodium ions; in addition, the material property of the first oxygen-rich dielectric layer 111 are similar to the material property of the substrate 111, such that the stress damage caused by the first oxygen-rich dielectric layer 111 to the substrate 111 is reduced; moreover, the rich oxygen atoms can bind to the unsaturated silicon atoms on the first surface 10a, such that the density of the hanging bonds is reduced, the carrier recombination is suppressed, and the photoelectric conversion efficiency is improved.

In some embodiments, the material of positive electricity and the material of negative electricity in the first oxygen-rich dielectric layer 111 are mixed with each other without a clear boundary. In other embodiments, the first oxygen-rich dielectric layer 111 has a multi-layer structure, as shown in FIG. 2, the first oxygen-rich dielectric layer 111 includes an aluminum oxide layer and a silicon oxynitride layer, and the aluminum oxide layer is disposed between the silicon oxynitride layer and the substrate.

FIG. 3 is an example of elemental analysis for the first passivation stack of the solar cell according to an embodiment. Referring to FIG. 3, a position section of 0-37.5 nm, in which the silicon element is the majority, refers to the substrate 10; a position section of 37.5-50 nm, in which the oxygen element and the aluminum element are the majority, refers to the aluminum oxide layer in the first oxygen-rich dielectric layer 111; a position section of 50-53 nm, in which the atomic fraction of oxygen and the atomic fraction of aluminum decrease gradually and the atomic fraction of silicon and the atomic fraction of nitrogen increase gradually, means that the silicon nitride layer is to be formed on the aluminum oxide layer, but it is noteworthy that the atomic fraction of nitrogen decreases suddenly near a position of 52 nm, which may be caused by sputtering of the oxygen element in the aluminum oxide layer and then mixing of the oxygen element with the nitrogen ions and the silicon ions due to the bombardment of the nitrogen ion source and the silicon ion source having specific contents, and finally forming a thin silicon oxynitride layer; a position section of 53-85 nm and a position section of 90-125 nm, in which the nitrogen element and the silicon element are the majority, respectively refer to the first silicon-rich dielectric layer 112 including a first silicon nitride material and the second silicon-rich dielectric layer 114 including a second silicon nitride material; a position section of 85-90 nm, in which the oxygen element and the silicon element are the majority and the proportion of the atomic fraction of silicon decreases by a certain extent with respect to both sides, refers to the second oxygen-rich dielectric layer 113, and the atomic fraction of oxygen in the second oxygen-rich dielectric layer 113 is greater than the atomic fraction of silicon in the first silicon-rich dielectric layer 112 and the second silicon-rich dielectric layer 114. In addition, both the first oxygen-rich dielectric layer 111 and the second oxygen-rich dielectric layer 113 have a peak in the atomic fraction of oxygen, which indicates that the oxygen element migrates and permeates into adjacent layer(s). Similarly, the atomic fraction of nitrogen in the first silicon-rich dielectric layer 112 and the second silicon-rich dielectric layer 114 gradually increases and then gradually decreases, which indicates that the nitrogen element migrates and permeates into adjacent layer(s). The silicon oxynitride layer can reduce stress damage and interface defects between aluminum oxide layer and silicon nitride layer, suppress carrier recombination and improve photoelectric conversion efficiency of the solar cell.

It should be noted that, whether the first oxygen-rich dielectric layer 111 is of single-layer structure or multi-layer structure, when the first oxygen-rich dielectric layer 111 includes mainly aluminum oxide material, based on consideration of both the negative electricity and the hardness, it is necessary to limit the composition proportion of the aluminum oxide material covering the first surface 10a, for example, by setting a ratio of the number of oxygen atoms to the number of aluminum atoms to be in a range of 0.6 to 2.4, for example, 1, 1.5, or 2, so that the negative electricity of the first oxygen-rich dielectric layer 111 is controlled within a reasonable range, thereby balancing the field passivation effect of the aluminum oxide material on the substrate 111 and the attractive force applied by the aluminum oxide to the sodium ions Na+, and ensuring that the first oxygen-rich dielectric layer 111 has a higher density and a lower hardness, so that the first oxygen-rich dielectric layer 111 has a better blocking effect to the sodium ions Na+ and that the first oxygen-rich dielectric layer 111 applies a lower stress to the substrate 111.

For example, a refractive index of the first oxygen-rich dielectric layer 111 may be in a range of 1.71 to 1.81, for example, 1.173, 1.76, and 1.79, and a thickness of the first oxygen-rich dielectric layer 111 in a direction perpendicular to the first surface 10a may be in a range of 1 nm to 20 nm, particularly, 5 nm to 10 nm, for example, 6 nm, 7 nm, 8 nm, or 9 nm.

Further, when the first oxygen-rich dielectric layer 111 includes at least one of silicon oxide and silicon oxynitride, based on consideration of both the positive electricity and the density, the content of different elements in the first oxygen-rich dielectric layer 111 needs to be limited, specifically, the refractive index of the first oxygen-rich dielectric layer 111 needs to be limited. Meanwhile, since silicon oxide is of higher compactness and thus better barrier property compared with silicon oxynitride, in order to make the first oxygen-rich dielectric layer 111 including silicon oxynitride meet a preset requirement for barrier property, the first oxygen-rich dielectric layer 111 including silicon oxynitride needs to have a relatively thick thickness.

For example, the first oxygen-rich dielectric layer 111 includes a silicon oxide material, the refractive index of the first oxygen-rich dielectric layer 111 is in a range of 1.58 to 1.61, for example, 1.59, or 1.60, and the thickness of the first oxygen-rich dielectric layer 111 in the direction perpendicular to the first surface 10a is in a range of 2 nm to 15 nm, for example, 5 nm, 8 nm, 10 nm, or 13 nm. Alternatively, the first oxygen-rich dielectric layer 111 includes a silicon oxynitride material, the refractive index of the first oxygen-rich dielectric layer 111 is in a range of 1.61 to 1.71, for example, 1.62, 1.65, or 1.68, and the thickness of the first oxygen-rich dielectric layer 111 in the direction perpendicular to the first surface 10a is in a range 8 nm to 15 nm, for example, 10 nm, 12 nm, or 14 nm.

In some embodiments, the first oxygen-rich dielectric layer 111 including a silicon oxide material may be formed by oxidizing the substrate 10 in an oxygen-rich atmosphere, a process temperature therefor may be in a range of 450° C. to 500° C., for example, 460° C., 470° C., 480° C., or 490° C., a process time therefor may be in a range of 15 min to 30 min, for example, 18 min, 23 min, or 28 min, and a volume ratio of oxygen in the oxygen-rich atmosphere may be greater than 21% to ensure a higher density of the silicon oxide material. Meanwhile, the silicon oxide material may be formed on the surface of the substrate 10 by ozone oxidation, nitrous oxide oxidation, or nitric acid passivation. A layer of negative electricity including at least some of aluminum oxide, gallium oxide, titanium oxide, or hafnium oxide or the first oxygen-rich dielectric layer 111 may be formed by atomic layer deposition and plasma-enhanced deposition, so that the layer of negative electricity has a higher density.

In some embodiments, the material of the second oxygen-rich dielectric layer 113 includes at least one of silicon oxide and silicon oxynitride. The atomic fraction of oxygen in the second oxygen-rich dielectric layer 113 is controlled to be in a range of 30% to 80%, for example, 40%, 50%, 60%, or 70%, which renders an appropriate range of refractive index for the second oxygen-rich dielectric layer 113, as a low refractive index may cause internal reflection and emission of the incident light through the second silicon-rich dielectric layer 114. It can be understood that, when the absorption rate of the short wave is low, the photovoltaic module presents blue or dark blue, which is disadvantageous for preparing the photovoltaic module having a black appearance. As an example, the atomic fraction of oxygen in the second oxygen-rich dielectric layer 113 is in a range of 50% to 80%.

In some embodiments, the refractive index of the second oxygen-rich dielectric layer 113 is lower so as to make the incident light falling on the substrate 10 as vertically as possible. That is, the refractive index of the first oxygen-rich dielectric layer 111 is larger than the refractive index of the second oxygen-rich dielectric layer 113, and the refractive index of the first silicon-rich dielectric layer 112 is larger than the refractive index of the second oxygen-rich dielectric layer 113, so that the incident light enters the substrate 10 as vertically as possible after passing through the second oxygen-rich dielectric layer 113, the first silicon-rich dielectric layer 112 and the first oxygen-rich dielectric layer 111, which reduces internal reflection and emission of the light, and improves the light absorption efficiency of the solar cell. As an example, the refractive index range of the first oxygen-rich dielectric layer 111 may be in a range of 1.58 to 1.78, for example, 1.63, 1.68, or 1.73, and the refractive index of the second oxygen-rich dielectric layer 113 may be in a range of 1.56 to 1.62, for example, 1.57, or 1.59.

In the direction perpendicular to the first surface 10a, the thickness of the first oxygen-rich dielectric layer 111 may be greater than the thickness of the second oxygen-rich dielectric layer 113, and the thickness of the first silicon-rich dielectric layer 112 may be greater than the thickness of the second oxygen-rich dielectric layer 113, so as to satisfy the aforementioned relationship between the refractive indexes. In this way, it is advantageous for the first silicon-rich dielectric layer 112 to mainly absorb long-wave light, and for the first oxygen-rich dielectric layer 111 and the second oxygen-rich dielectric layer 113 to mainly absorb short-wave light of various wavelengths, so as to ensure a higher light absorption efficiency of the solar cell for different wavelength bands, and make the photovoltaic module to have a black appearance.

In some embodiments, the second oxygen-rich dielectric layer 113 includes a silicon oxynitride material. The refractive index of the second oxygen-rich dielectric layer 113 is in a range of 1.56 to 1.62, for example, 1.57, or 1.59. In the direction perpendicular to the first surface 10a, the thickness of the second oxygen-rich dielectric layer 113 is in a range of 5 nm to 20 nm, particularly, 5 nm to 18 nm, for example, 7 nm, 10 nm, 13 nm, or 16 nm. Based on the requirements of the refractive index of the second oxygen-rich dielectric layer 113, the ratio of the number of oxygen atoms to the number of nitrogen atoms in the silicon oxynitride material may be in a range of 2.58 to 7.58, for example, 3.5, 4.5, 5.5, or 6.5. The nitrogen element in the silicon oxynitride material may be derived from preparation process or may be derived from element diffusion of adjacent layer(s). The presence of the nitrogen element contributes to improve the refractive index of the second oxygen-rich dielectric layer 113, suppress the internal reflection due to low refractive index, improve matching of the second nitrogen-rich dielectric layer 113 with the adjacent layer(s) including a silicon nitride material, and reduce a contact stress between the second nitrogen-rich dielectric layer 113 and the adjacent layer(s).

In some embodiments, the refractive index of the first silicon-rich dielectric layer 112 is greater than the refractive index of the second silicon-rich dielectric layer 114, which reduces difference between the refractive indexes of the second silicon-rich dielectric layer 114 and the second oxygen-rich dielectric layer 113, thus reduce internal reflection and emission of the light due to the difference between the refractive indexes. Further, it is advantageous to make the refractive index of the first silicon-rich dielectric layer 112 larger than the refractive index of the second oxygen-rich dielectric layer 113, which increases a gradient of refractive index, thereby ensuring effectively incident light on the substrate, and improving the light absorption efficiency of the solar cell. As an example, the refractive index of the first silicon-rich dielectric layer 112 may be in a range of 2.02 to 2.2, for example, 2.04, 2.06, 2.10, 2.14, or 2.18, and the refractive index of the second silicon-rich dielectric layer 114 may be in a range of 1.98 to 2.06, for example, 2.00, 2.02, or 2.04.

Accordingly, the thickness of the first silicon-rich dielectric layer 112 may be greater than the thickness of the second silicon-rich dielectric layer 114 in a direction perpendicular to the surface of the substrate 10 to satisfy the aforementioned relationship of the refractive indexes. In this way, it is advantageous for the first silicon-rich dielectric layer 112 and the second silicon-rich dielectric layer 114 to mainly absorb the long-wave light of different wavelengths, thereby improving the light absorption efficiency of the solar cell for different wavelength bands.

In some embodiments, the material of the first silicon-rich dielectric layer 112 includes nitrogen silicide. During determination on atomic fraction of element in the first silicon-rich dielectric layer 112, it is necessary to prevent the first silicon-rich dielectric layer 112 from being of excessively strong positive electricity (which diminishes the field passivation effect of the first oxygen-rich dielectric layer 111 and/or the electrical property of the emitter 102), and meanwhile it is necessary to prevent the first silicon-rich dielectric layer 112 from being of excessively weak positive electricity (which is disadvantageous for blocking of the sodium ions Na+ by electricity repulsion), of excessively low refractive index (which is likely to cause internal reflection and emission of the light), or of excessively low compactness (which is also disadvantageous for blocking of the sodium ions Na+ by electricity repulsion). Based on the above considerations, the first silicon-rich dielectric layer 112 includes a first silicon nitride material in which a ratio of the number of silicon atoms to the number of nitrogen atoms is in a range of 0.66 to 2.3, for example, 1.1, 1.6, or 2.1.

To enable the different layers to mainly absorb light of different wavelengths and to enable the light incident through the second oxygen-rich dielectric layer 113 to better enter the substrate 10, under the condition of the aforementioned ratio of atoms, the refractive index of the first silicon-rich dielectric layer 112 may be in a range of 2.02 to 2.2, for example, 2.04, 2.06, 2.10, 2.14, or 2.18, a thickness of the first silicon-rich dielectric layer 112 in the direction perpendicular to the first surface 10a is in a range of 20 nm to 50 nm, particularly, 20 nm to 40 nm, for example, 25 nm, 30 nm, or 35 nm. The first silicon-rich dielectric layer 112 should be thick enough to refract the light into the substrate 10, and should be thin enough to prevent applying an excessive stress to the first oxygen-rich dielectric layer 111, to avoid interface defects, and to reduce an overall size of the solar cell.

The first silicon-rich dielectric layer 112 may be an oxygen-doped silicon nitride layer in which the atomic fraction of oxygen is relatively small, that is, the first silicon-rich dielectric layer 112 is a silicon-rich oxygen-deficient dielectric layer (which may also be referred to as a first silicon-rich oxygen-deficient dielectric layer). In some embodiments, the oxygen atoms are derived from an adjacent oxygen-rich dielectric layer, and the oxygen atoms in the adjacent oxygen-rich dielectric layer diffuse into the first silicon-rich dielectric layer 112 based on a set process, for example, by concentration difference or thermal energy imparted based on a heat treatment process. In other embodiments, the oxygen atoms are derived from residual oxygen source gas in the reaction chamber or designedly reserved oxygen source gas.

The first oxygen-rich dielectric layer 111 and the first silicon-rich dielectric layer 112 may be successively formed in the same reaction chamber. Before the first silicon-rich dielectric layer 112 is formed, if a duration for purging process is not long enough or a part of a reactant is attached to a side wall of the reaction chamber, oxygen atoms may remain in the reaction chamber. During the formation of the first silicon-rich dielectric layer 112, the oxygen atoms may be doped into the silicon nitride material, thereby forming oxygen-doped silicon nitride. If the material of the first oxygen-rich dielectric layer 111 is silicon oxide, after a deposition process of silicon oxide is performed, the oxygen source gas may be directly replaced with the nitrogen source gas to form silicon nitride. Before the replacement with the nitrogen source gas, if the oxygen source gas is retained in the reaction chamber, the oxygen-doped silicon nitride is finally formed. It should be noted that the oxygen source gas in the reaction chamber may be accidentally retained or designedly retained, so as to control the atomic fraction of oxygen in the first silicon-rich dielectric layer 112.

In an example in which the first silicon-rich dielectric layer 112 is an oxygen-doped silicon nitride layer, the first silicon-rich dielectric layer 112 is provided as a silicon-rich oxygen-deficient dielectric layer, it is necessary to control the atomic fraction of oxygen in the first silicon-rich dielectric layer 112 to be greater than 0% and less than or equal to 10%, for example, 2%, 4%, 6% or 8%, so that the material property of the first oxygen-rich dielectric layer 111 are closer to that of the first silicon-rich dielectric layer 112, thereby improving the interface property between them. Specifically, when the material of the first oxygen-rich dielectric layer 111 is a material of negative electricity, such as aluminum oxide, etc., the doped oxygen atoms make the first oxygen-rich dielectric layer 111 and the first silicon-rich dielectric layer 112 have a same element, and the lattice property of the first oxygen-rich dielectric layer 111 is close to that of the first silicon-rich dielectric layer 112, thereby facilitating reduction of interface defects and stress damage between the first oxygen-rich dielectric layer 111 and the first silicon-rich dielectric layer 112.

In some embodiments, when the material of the first oxygen-rich dielectric layer 111 is silicon oxide, doped oxygen atoms may not be required in the first silicon-rich dielectric layer 112 as both the layers include a same element (i.e., silicon), so that the atomic fraction of oxygen in the first silicon-rich dielectric layer 112 may be 0%. In other embodiments, the atomic fraction of oxygen in the first silicon-rich dielectric layer 112 is greater than 0% and less than or equal to 7%.

In addition, the doped oxygen atoms may be used for adjusting the positive electricity and the refractive index of the first silicon-rich dielectric layer 112. The more the oxygen atoms, the weaker the positive electricity and the lower the refractive index. By doping a certain amount of oxygen atoms, the first silicon-rich dielectric layer 112 has a relatively strong positive electricity, and meanwhile, the first silicon-rich dielectric layer 112 is prevented from being of excessively strong positive electricity (which diminishes the field passivation effect of the first oxygen-rich dielectric layer 111 and the electrical property of the emitter 102), and of excessively high refractive index, so as to avoid internal reflection caused by the excessive difference between the refractive indexes of the first silicon-rich dielectric layer 112 and the first oxygen-rich dielectric layer 111.

In some embodiments, the material of the second silicon-rich dielectric layer 114 includes nitrogen silicide. During determination on atomic fraction of the second silicon-rich dielectric layer 114, it is necessary to control the second silicon-rich dielectric layer 114 to be of higher refractive index so that the light incident through the second silicon-rich dielectric layer 114 vertically falls into the substrate 10, and it is necessary to control a smaller difference between the refractive indexes of the second silicon-rich dielectric layer 114 and the second oxygen-rich dielectric layer 113, thereby suppressing internal reflection and emission of the light. Based on the above considerations, the second silicon-rich dielectric layer 114 may include a second silicon nitride material in which a ratio of silicon atoms to nitrogen atoms is in a range of 3.82 to 6.37, for example, 4.35, 4.85, 5.35, or 5.85.

Accordingly, in order to make the first silicon-rich dielectric layer 112 and the second silicon-rich dielectric layer 114 mainly absorb long-wave light of different wavelengths and as much as possible to suppress internal reflection and emission of the light passing through the different layers, under the condition of the aforementioned ratio of atoms, the refractive index of the second silicon-rich dielectric layer 114 may be in a range of 1.98 to 2.06, for example, 2.00, 2.02, 2.04, and the thickness of the second silicon-rich dielectric layer 114 in the direction perpendicular to the first surface 10a may be in a range of 20 nm to 50 nm, particularly, 20 nm to 40 nm, for example, 25 nm, 30 nm, or 35 nm. Further, the second silicon-rich dielectric layer 114 should be thick enough to refract the light into the substrate 10, and should be thin enough to prevent applying an excessive stress to the second oxygen-rich dielectric layer 113 which results in interface defects, and to reduce an overall size of the solar cell.

In some embodiments, the second silicon-rich dielectric layer 114 is doped with oxygen atoms, but the number of doped oxygen atoms is small, that is, the second silicon-rich dielectric layer 112 is a silicon-rich oxygen-deficient dielectric layer (also referred to as a second silicon-rich oxygen-deficient dielectric layer), and the doped oxygen atoms are used to alleviate the stress between the second silicon-rich dielectric layer 114 and the second oxygen-rich dielectric layer 113. For example, the atomic fraction of oxygen in the second silicon-rich dielectric layer 114 is greater than 0% and less than or equal to 10%, particularly, greater than 0% and less than or equal to 7%, for example, 2%, 4% or 6%.

In some embodiments, the first silicon-rich dielectric layer 112 and the second silicon-rich dielectric layer 114 are silicon-rich layers other than the oxygen-doped silicon nitride layers, such as silicon carbide layers or oxygen-doped silicon carbide layers, or the first silicon-rich dielectric layer 112 and the second silicon-rich dielectric layer 114 further include other elements besides oxygen, nitrogen, and silicon. In order to ensure that the first silicon-rich dielectric layer 112 and the second silicon-rich dielectric layer 114 are of higher refractive index, the atomic fraction of silicon in the first silicon-rich dielectric layer 112 and the second silicon-rich dielectric layer 114 may be in a range of 30% to 70%, for example, 40%, 50% or 60%.

In some embodiments, the atomic fraction of silicon in the first silicon-rich dielectric layer 112 is greater than the atomic fraction of silicon in the second silicon-rich dielectric layer 114, such that the refractive index of the first silicon-rich dielectric layer 112 is higher, and thus a gradient of refractive index changes from small to large is formed to suppress internal reflection and emission of the light. For example, in the second silicon-rich dielectric layer 114, the atomic fraction of silicon may be in a range of 30% to 60%, for example, 35%, 40%, 45%, 50% or 55%, and a ratio of the atomic fraction of silicon to the atomic fraction of nitrogen may be in a range of 0.46 to 1.87, for example, 0.8, 1.1, 1.4 or 1.7; in the first silicon-rich dielectric layer 112, the atomic fraction of silicon may be in a range of 40% to 70%, for example, 45%, 50%, 55%, 60% or 65%, and a ratio of the atomic fraction of silicon to the atomic fraction of nitrogen may be in a range of 0.66 to 2.3, for example, 1, 1.3, 1.6, 1.9 or 2.2.

In some embodiments, the solar cell further includes at least one stacked structure disposed in a direction away from the substrate 10, the stacked structure further includes an oxygen-rich layer and an oxygen-deficient dielectric layer that are sequentially stacked. That is, in some embodiments, the solar cell surface may be provided with at least three stacked structures to enhance the electrical property of the oxygen-rich dielectric layer and the electrical property of the oxygen-deficient dielectric layer.

In some embodiments, the second surface 10b is further provided with a passivation contact structure including at least a tunneling oxide layer 121 and a doped conductive layer 122 that are sequentially disposed in a direction away from the substrate 10. The material of the tunneling oxide layer 121 is a dielectric material, such as silicon oxide, for achieving interface passivation of the second surface 10b. A thickness of the tunneling oxide layer 121 in a direction perpendicular to the rear surface 10b may be in a range of 0.5 nm to 3 nm, for example, 1 nm, 1.5 nm, 2 nm, or 2.5 nm.

The material of the doped conductive layer 122 used to form field passivation may be, for example, doped silicon, which may be one or more of doped polysilicon, doped microcrystalline silicon or doped amorphous silicon. A type of the doped ions of the doped conductive layer 122 is the same as a type of the doped ions of the base region 101. A thickness of the doped conductive layer 122 in the direction perpendicular to the rear surface 10b may be in a range 80 nm to 160 nm, for example, 100 nm, 120 nm or 140 nm, and a refractive index of the doped conductive layer 122 may be in a range of 3.5 to 4.5, for example, 3.75, 4, or 4.25.

In some embodiments, the doped conductive layer 122 is further provided thereon with a second passivation layer 123 for enhancing reflection effect of the incident light on the back of the cell. The second passivation layer 123 may be a single-layer structure or a multi-layer structure in which different sub-layers may be made form a same material but different in refractive index, or may be made from different materials. The second passivation layer 123 may include a plurality of sub-layers, and the plurality of sub-layers gradually decreases in refractive index in the direction from second surface 10b to the doped conductive layer 122, thereby using internal reflection to enhance the reflection effect of the incident light on the back of the cell. When the material of the second passivation layer 123 is silicon nitride, the silicon nitride sub-layer of higher refractive index has more hydrogen ions which may migrate to the second surface 10b under a diffusion power due to concentration difference or a thermal power formed by a heat treatment process, so as to passivate interface defects between the substrate 10 and the passivation contact structure and thus suppress the carrier recombination and improve the photoelectric conversion efficiency.

Specifically, the second passivation layer 123 may include a bottom passivation layer, an intermediate passivation layer, and a top passivation layer that are sequentially disposed, and the bottom passivation layer covers a surface of the doped conductive layer 122. The bottom passivation layer has a refractive index in a range of 2.12 to 2.2, for example, 2.14, 2.16, or 2.18, and a thickness in the direction perpendicular to the second surface 10b a range of 10 nm to 20 nm, for example, 13 nm, 15 nm, or 18 nm. The intermediate passivation layer has a refractive index in a range of 2.10 to 2.12, for example, 2.13, 2.15 or 2.18, and a thickness in a range of 20 nm to 30 nm, for example, 23 nm, 25 nm or 28 nm. The top passivation layer has a refractive index in a range of 2.09 to 2.10, and a thickness in a range of 30 nm to 50 nm, for example, 35 nm, 40 nm or 45 nm. In general, the second passivation layer 123 has an average refractive index in a range of 2.04 to 2.2, for example, 2.08, 2.12, or 2.16, and a thickness in the direction perpendicular to the second surface 10b in a range of 60 nm to 100 nm, for example, 70 nm, 80 nm, or 90 nm.

Further, the solar cell further includes a first electrode 115 electrically connected to the emitter 102 and a second electrode 124 passing through the passivation layer 123 to electrically connected to the field passivation layer 122. In some embodiments, the first electrode 115 and/or the second electrode 124 may be form by sintering and printing a conductive paste (silver paste, aluminum paste, or silver-aluminum paste).

In some embodiments, the oxygen-rich dielectric layer and the silicon-rich dielectric layer are sequentially disposed. Compared with the silicon-rich dielectric layer, the oxygen-rich dielectric layer is of higher density, weaker positive electricity and lower hardness, which contribute to preventing external ions from diffusing into the substrate and to reducing defect density and stress damage of the emitter, or may be of stronger negative electricity, which contributes to forming field passivation on the substrate and realizing selective transmission of carriers. At least two oxygen-rich dielectric layers are provided, which may strengthen any one of the aforementioned effects or make the solar cell have both effects. In addition, compared with the oxygen-rich dielectric layer, the silicon-rich dielectric layer generally has a higher refractive index. The two silicon-rich dielectric layers are spaced from each other, which is advantageous for causing two gradients of refractive index, so that light of different wavelengths can effectively enter into the substrate, which improves the absorption efficiency of the solar cell. Moreover, the atomic fraction of oxygen in the second oxygen-rich dielectric layer is larger than the atomic fraction of oxygen in the first oxygen-rich dielectric layer, which contributes to blocking the external ions or other impurities in the outer layer, avoiding influence on antireflection performance of the first silicon-rich dielectric layer, and ensuring a higher efficiency for light absorption of the solar cell.

Figure 4:
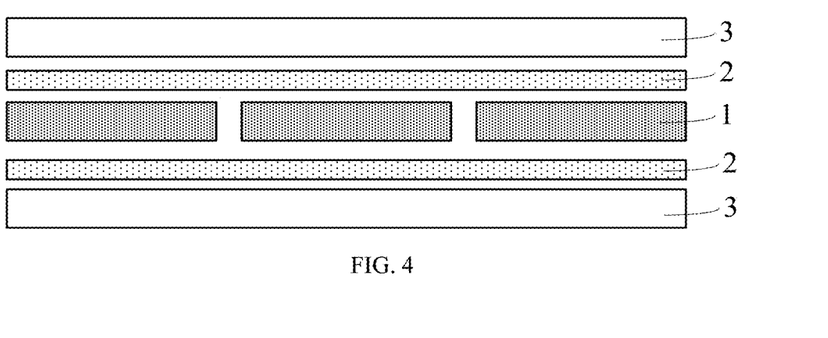
FIGS. 4 and 5 are schematic structural diagrams of a photovoltaic module according to an embodiment of the present disclosure.

Embodiments of the present disclosure further provide a photovoltaic module for converting received light energy into electrical energy. Referring to FIG. 4, the photovoltaic module includes a cell string (not shown), a package adhesive film 2, and a cover plate 3. The cell string is formed by connecting a plurality of solar cells 1. The solar cells 1 may be any of the foregoing solar cells (including but not limited to the solar cells of FIG. 1). Adjacent solar cells 1 are electrically connected by a conductive tape (not shown). The package adhesive film 2 may be an organic package adhesive film, such as an ethylene-vinyl acetate copolymer (EVA) adhesive film, a polyethylene octene co-elastomer (POE) adhesive film, or a polyethylene terephthalate (PET) adhesive film. The package adhesive film 2 covers a surface of the cell string for sealing. The cover plate 3 may be transparent or semi-transparent cover plate, such as a glass cover plate or a plastic cover plate, and the cover plate 3 covers a surface of the package adhesive film 2 facing away from the cell string. In some embodiments, a light trapping structure is provided on the cover plate 3 to improve utilization of incident light. The light trapping structure may be varied depend on the cover plate 3. The photovoltaic module is of better ability in current collecting and lower carrier recombination rate, which can achieve higher photoelectric conversion efficiency. Meanwhile, the photovoltaic module has a dark blue or even black appearance in the front, which is wildly applicable.

Since the package adhesive film 2 and the cover plate 3, when disposed on a rear surface of the solar cell 1, may block or weaken the weaker light, in some embodiments, the package adhesive film 2 and the cover plate 3 are disposed only on a front surface of the solar cell 1 to avoid such blocking or weakening. Meanwhile, the photovoltaic module can be fully packaged at its sides, that is, the sides of the photovoltaic module is completely covered by the package adhesive film 2, so as to prevent the layers of the photovoltaic module from shifting during the lamination process, and prevent the external environment from affecting the performance of the solar cell through the side of the photovoltaic module, such as water vapor intrusion.

Figure 5:
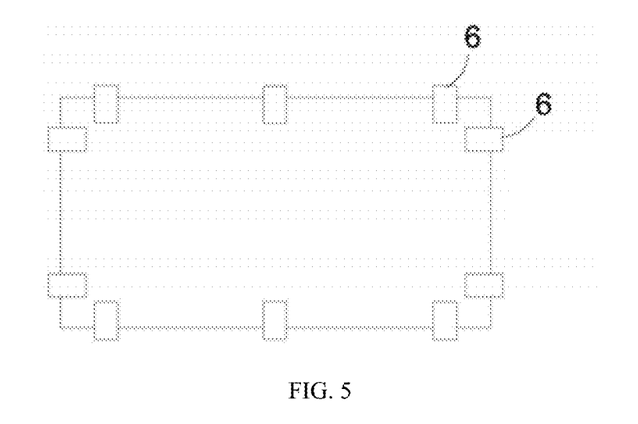

In some embodiments, referring to FIG. 5, the photovoltaic module further includes an edge sealing member 6 that fixedly packages at least the sides of the photovoltaic module. Further, the edge sealing member 6 at least fixedly packages to the sides of the photovoltaic module near the corners. The edge sealing member 6 may be a high-temperature resistant adhesive tape. Based on the high-temperature resistance of the high-temperature resistant adhesive tape, during the lamination process or during use of the solar cell, the edge sealing member 6 does not decompose or fall off, which ensures reliable package of the photovoltaic module. In some embodiments, the high-temperature resistant adhesive tape is affixed not only to the sides of the photovoltaic module, but also to the front and rear surfaces of the photovoltaic module, which prevents the layers of the photovoltaic module from shifting during the lamination process and avoids deformation of the photovoltaic module under stress. Embodiments of the present disclosure further provide a method for manufacturing a solar cell. Referring to FIG. 6 to FIG. 10 and FIG. 1, FIG. 4 to FIG. 10 and FIG. 1 are schematic structural diagrams corresponding to various steps of the method for manufacturing a solar cell according to the embodiment of the present disclosure.

Figure 6:
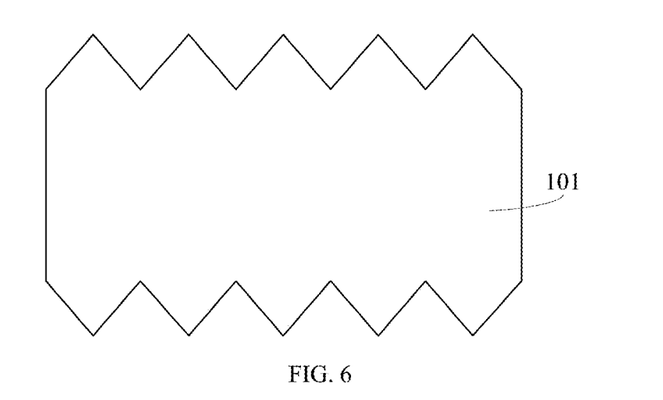
FIGS. 6 to 10 are schematic structural diagrams corresponding to various steps of a method for manufacturing a solar cell according to the embodiment of the present disclosure.

Referring to FIG. 6, a base region 101 is provided and textured at both sides.

Specifically, a N-type substrate is cleaned, and a pyramid-textured surface is formed thereon by wet chemical etching. The pyramid-textured surface can reduce light reflection on the surface of the base region 101, thereby improving absorption and utilization of the light on the base region 101 and improving conversion efficiency of the solar cell. In some embodiments, the base region 101 is made from monocrystalline silicon, and has a thickness in a range of 60 µm to 240 µm, in particular, 60 µm, 80 µm, 90 µm, 100 µm, 120 µm, 150 µm, 200 µm, or 240 µm, and a resistivity in a range of 0.3 ohm·cm to 2 ohm·cm.

It should be noted the specific operation of the texturing process is not limited herein. For example, the texturing process is not limited to the wet chemical etching. When the base region 101 is made from N-type monocrystalline silicon, an alkaline solution, such as potassium hydroxide solution, may be used for the texturing process. The anisotropic corrosion of NaOH solution contributes to preparation of a pyramidal microstructure. The pyramidal microstructure may be tetrahedral, approximately tetrahedral, pentahedral, approximately pentahedral, or the like. In addition, the texturing process may be chemical etching, laser etching, mechanical process, plasma etching, etc. The pyramidal microstructure enables the screen-printed metal paste to be better filled in the microstructure when forming the electrode, thereby obtaining better contact of the electrodes, effectively reducing resistance of the cells connected in series and improving the filling factor. An overall reflectivity of the solar cell may be less than 10% by controlling the morphology of the pyramidal microstructure.

Figure 7:
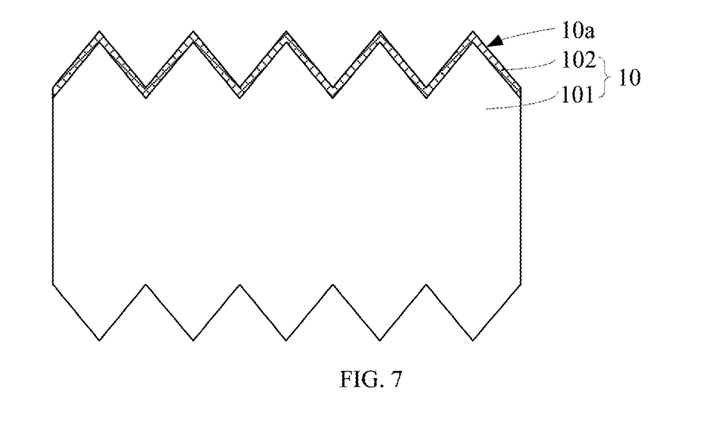

Referring to FIG. 7, a P-type emitter 102 is formed.

After texturing of both sides of the base region 101, a first surface 10a of the base region 101 is subjected to a boron diffusion treatment to form a P-type emitter 102 which occupies a part of a surface layer of the base region 101 for receiving the light. The P-type emitter 102 and the N-type base region 101 constitute a substrate 10. The P-type emitter 102 has a diffusion square resistance in a range of 130Ω to 150Ω and a surface diffusion concentration in a range of E18 to E19.

It should be noted that in the boron diffusion treatment, borosilicate glass is additionally generated on a front surface (i.e., the first surface 10a), a rear surface and a side surface of the base region 101, and thus prevents the surfaces of the base region 101 from being damaged in some subsequent processes. That is, the additional borosilicate glass may serve as a mask layer for the base region 101. A boron source for the boron diffusion treatment includes liquid boron tribromide, and during the boron diffusion treatment, a phrase change occurs from a microcrystalline silicon phase to a polycrystalline silicon phase.

Figure 8:
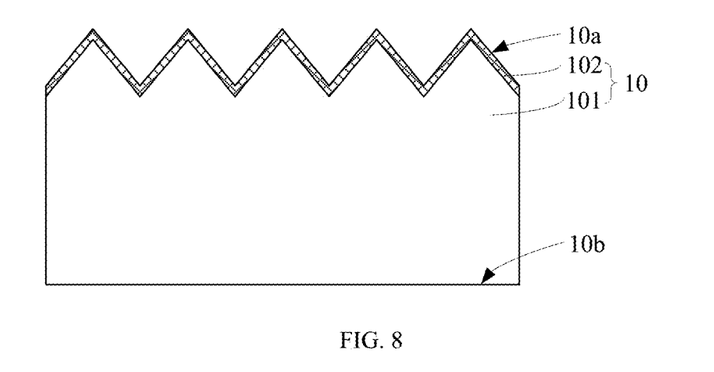

Referring to FIG. 8, a planarization process (e.g., polishing) is performed on the rear surface of the base region 101.

The rear surface is at a side of the solar cell facing away from the light. Due to the planarization process, the rear surface is planarized to form a flat surface for depositing layers thereon, i.e., the second surface 10b. During the planarization process, the borosilicate glass on the rear surface is removed.

In some embodiments, before a polishing process, the method further includes the following steps: the borosilicate glass on the surface of the base region 101 is removed with a prepared mixed acid which includes a hydrofluoric acid solution having a mass fraction in a range of 0.1% to 10%, a sulfuric acid solution having a mass fraction in a range of 10% to 20% and a nitric acid solution having a mass fraction of 25% to 50%, with a pickling time in a range 10 s to 180 s and a pickling temperature in a range of 7° C. to 20° C.; and then the pickled rear surface 10b is washed with water and dried. It should be noted that a porous structure may be formed on the rear surface 10b of the substrate 10 after pickling.

In some embodiments, the rear surface 10b may be polished with an alkali solution. Specifically, the surface 10b is cleaned with the alkali solution having a mass fraction in a range of 5% to 15% to remove porous silicon. The rear surface 10b is roughened by spraying microdroplets of the alkali solution on the rear surface 10b, and then pre-cleaned with hydrofluoric acid having a mass fraction in a range of 5% to 10%. The rear surface 10b is polished with a polishing solution, with a polishing temperature in a range of 70° C. to 80° C. and a polishing time of less than 260 s, and the polishing solution includes NaOH having a mass fraction in a range of 1% to 15%, KOH having a mass fraction in a range of 1% to 15% and additive having a mass fraction in a range of 0.5% to 2.5%. Organic components are removed from the etching solution with a mixed solution which includes potassium hydroxide having a mass fraction in a range of 5% to 15% and hydrogen peroxide having a mass fraction in a range of 15% to 40%. Then the polished substrate 10 is washed with water and dried.

In some embodiments, since the rear surface 10b is of low concentration in boron, etching with the alkali solution can effectively improve etching efficiency. The alkali solution includes an organic base and/or an inorganic base. The inorganic base may be NaOH, KOH, Ga(OH)2, or NH3·H2O. The organic base may be triethylamine, nitrophenol, pyridine, quinine, colchicine, or the like. The additive in the polishing solution may be a buffer solution including sodium sulfonate, maleic anhydride, alkyl glycoside, and the like. In some embodiments, a weight loss of the substrate 10 is less than 0.3 g after being polished, and the rear surface 10b may have a preset structure by controlling the polishing time and the polishing temperature.

Figure 9:
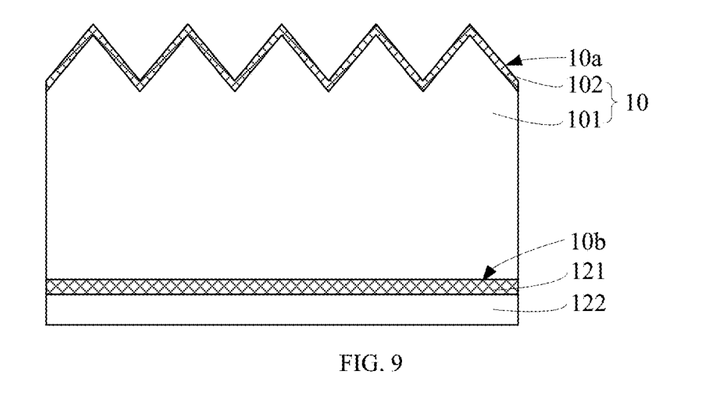

Referring to FIG. 9, a tunneling oxide layer 121 and a doped conductive layer 122 are formed.

In some embodiments, the tunneling oxide layer 121 is formed by means of a deposition process. Specifically, the material of the tunneling oxide layer 121 includes silicon oxide, the deposition process includes a chemical vapor deposition process, and the thickness of the tunneling oxide layer 121 in a direction perpendicular to the second surface 10b is in a range of 1 nm to 2 nm, for example, 1.2 nm, 1.4 nm, 1.6 nm, or 1.8 nm. In other embodiments, the tunneling oxide layer may be formed by means of an in-situ generation process. Specifically, the tunneling oxide layer may be formed in-situ by a thermal oxidation process and a nitric acid passivation process based on a silicon substrate.

In some embodiments, the tunneling oxide layer 121 is formed by deposition on the rear surface 10b by means of a variable temperature process and a chemical vapor deposition method. During deposition, a heating rate is in a range of 0.5° C./min to 3° C./min, for example, 1.0° C./min, 1.5° C./min, 2.0° C./min, or 2.5° C./min, etc., a deposition temperature is in a range of 560° C. to 620° C., for example, 570° C., 590° C., or 610° C., etc., and a deposition time is in a range of 3 min to 10 min, for example, 4 min, 6 min, or 8 min, etc.

In some embodiments, after the tunneling oxide layer 121 is formed, intrinsic polysilicon is deposited to form a polysilicon layer, and phosphorus ions are doped by ion implantation and source diffusion to form an N-type doped polysilicon layer as a doped conductive layer 122. The thickness of the doped conductive layer 122 in a direction perpendicular to the second surface 10b may be in a range of 80 nm to 160 nm, for example, 100 nm, 120 nm, or 140 nm.

When the tunneling oxide layer 121 and the doped conductive layer 122 are formed by means of the deposition process, since the first surface 10a of the base region 101 is protected by the borosilicate glass as a mask layer on the front surface, limitation to the deposition region on the rear surface through the mask is not required during the deposition process, and the borosilicate glass on the front surface and the silicon oxide and polysilicon deposited on the front surface can be removed simultaneously in a subsequent process. In this way, no additional mask is required, which is advantageous for reducing process steps, shortening process period, and lowering process cost. In other embodiments, when the interface passivation layer is formed by mean of the in-situ generation process, only polysilicon is deposited on the borosilicate glass on the front surface of the substrate.

In some embodiments, deposition of the tunneling oxide layer 121 and the polysilicon layer and doping of the polysilicon layer are performed in a low-pressure chemical vapor deposition apparatus. The specific steps are as follows: firstly, the alkali-polished substrate 10 is placed in the deposition apparatus; an oxygen source (which may be oxygen, nitrous oxide, ozone, for example) in a range of 20 L to 60 L is introduced; the chamber within the deposition apparatus is heated to a temperature in a range of 560° C. to 620° C. at a heating rate in a range of 0.5° C./min to 3° C./min for a deposition time in a range of 3 min to 10 min, so as to form the tunneling oxide layer 121; after the introduction of oxygen is completed, the temperature is controlled to be constant, and then silane gas of an appropriate amount is introduced to form the polysilicon layer; finally, the polysilicon layer is doped in situ to form the doped conductive layer 122.

Figure 10:
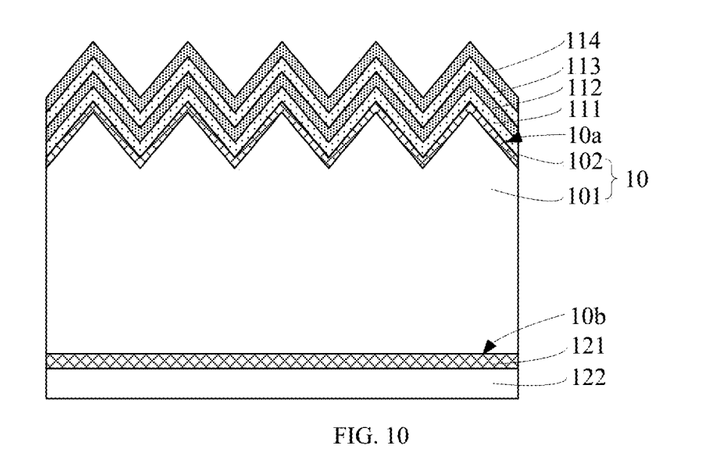

Referring to FIG. 10, a first passivation stack is formed on the first surface of the substrate 10, and includes a first oxygen-rich dielectric layer 111, a first silicon-rich dielectric layer 112, a second oxygen-rich dielectric layer 113, and a second silicon-rich dielectric layer 114 that are sequentially disposed. The first oxygen-rich dielectric layer 111 covers the first surface 10a.

In some embodiments, the redundant borosilicate glass, silicon oxide, and polysilicon coated on the first surface 10a of the substrate 10 need to be removed prior to forming the first passivation stack. In other embodiments, the redundant borosilicate glass and polysilicon coated on the first surface of the substrate need to be removed prior to forming the first passivation stack.

Further, in other embodiments, after the redundant material is removed, a thin silicon oxide layer is then generated on the first surface of the substrate. The thin silicon oxide layer is formed by natural oxidation, thermal oxidation, wet oxidation, atomic layer deposition, plasma-enhanced chemical vapor deposition, and the like. A thickness of the thin silicon oxide layer in the direction perpendicular to the substrate surface is in a range of 0 to 3 nm, for example, 1 nm, 1.5 nm, or 2 nm.

In some embodiments, the first oxygen-rich dielectric layer 111, the first silicon-rich dielectric layer 112, the second oxygen-rich dielectric layer 113, and the second silicon-rich dielectric layer 114 may be formed by processes, such as chemical vapor deposition, low-pressure chemical vapor deposition, plasma-enhanced chemical vapor deposition (including direct plasma deposition and indirect plasma deposition), magnetron sputtering, and the like. An atomic fraction of oxygen in the second oxygen-rich dielectric layer 113 is greater than that in the first oxygen-rich dielectric layer 111.

In some embodiments, the atomic fraction of oxygen in the first oxygen-rich dielectric layer is in a range of 40% to 70%, particularly 40% to 60%. The atomic fraction of oxygen in the first silicon-rich dielectric layer is greater than 0% and less than or equal to 10%, particularly greater than 0% and less than or equal to 7%. The atomic fraction of oxygen in the second oxygen-rich dielectric layer is in a range of 30% to 80%, particularly 50% to 80%. The atomic fraction of oxygen in the second silicon-rich dielectric layer is greater than 0% and less than or equal to 10%, particularly greater than 0% and less than or equal to 7%.

The first oxygen-rich dielectric layer 111 may include at least two oxygen-rich sub-layers. The material of the first oxygen-rich dielectric layer 111 includes at least one of aluminum oxide, silicon oxide, gallium oxide, hafnium oxide, titanium oxide, silicon oxynitride, and the like. If the material of the first oxygen-rich dielectric layer 111 is silicon oxynitride, the reactant therefor may be silane, nitrous oxide, and ammonia, and the first oxygen-rich dielectric layer 111 may have a refractive index in a range of 1.61 to 1.71 and a thickness in range of 8 nm to 20 nm. If the material of the first oxygen-rich dielectric layer 111 is silicon oxide, the reactant therefor may be at least one of silane, nitrous oxide, and oxygen, and the first oxygen-rich dielectric layer 111 may have a refractive index in a range of 1.58 to 1.61 and a thickness in a range of 2 nm to 15 nm. If the material of the first oxygen-rich dielectric layer 111 is aluminum oxide, the reactant therefor may be trimethylaluminum and water, and the first oxygen-rich dielectric layer 111 may have a refractive index in a range of 1.71 to 1.78, and a thickness in a range of 1 nm to 20 nm.

The material of the first silicon-rich dielectric layer 112 may be at least one of silicon nitride and silicon carbide. When the material of the first silicon-rich dielectric layer 112 is silicon nitride, the first silicon-rich dielectric layer 112 may be designed to include two or three sub-layers gradually changed in refractive index according to actual requirements. That is, the silicon nitride sub-layers gradually decrease in refractive index in a direction away from the substrate 10. Further, the reactant therefor may be silane and ammonia. A ratio of the number of silicon atoms to the number of nitrogen atoms in the first silicon-rich dielectric layer 112 may be in a range of 0.66 to 2.3. The first silicon-rich dielectric layer 112 may have a refractive index in the range of 2.02 to 2.2, and a thickness in a range of 20 nm to 50 nm.

The material of the second oxygen-rich dielectric layer 113 may be one of silicon oxide and silicon oxynitride, the reactant therefor includes silane, nitrous oxide and ammonia. A ratio of the number of oxygen atoms to the number of nitrogen atoms in the second oxygen-rich dielectric layer 113 may be in a range of 2.58 to 7.58. The second oxygen-rich dielectric layer 113 may have a refractive index in the range of 1.56 to 1.62, and a thickness in a range of 5 nm to 20 nm.

The material of the second silicon-rich dielectric layer 114 may be one of silicon nitride and silicon carbide. When the material of the second silicon-rich dielectric layer 114 is silicon nitride, the second silicon-rich dielectric layer 114 may be designed to include two or three sub-layers gradually changed in refractive index according to actual requirements. That is, the silicon nitride sub-layers gradually decrease in refractive index in a direction away from the substrate 10. Further, the reactant therefor may be silane and ammonia. A ratio of the number of silicon atoms to the number of nitrogen atoms in the second silicon-rich dielectric layer 114 may be in a range of 0.46 to 1.78. The second silicon-rich dielectric layer 114 may have a refractive index in the range of 1.98 to 2.06, and a thickness in a range of 20 nm to 50 nm.

Referring to FIG. 1, a second passivation layer 123 is formed on the doped conductive layer 122, and a first electrode 115 and a second electrode 124 are formed.

When the material of the second passivation layer 123 is silicon nitride, the second passivation layer 123 may be designed to include two, three or four sub-layers gradually changed in refractive index according to actual requirements. That is, the silicon nitride sub-layers gradually decrease in refractive index in a direction away from the substrate 10. Further, the reactant therefor may be silane and ammonia. A ratio of the number of silicon atoms to the number of nitrogen atoms in the second passivation layer 123 may be in a range of 3.82 to 6.37. The second passivation layer 123 may have a refractive index in the range of 2.04 to 2.2, and a thickness in a range of 60 nm to 100 nm.

After the second passivation layer 123 is formed, the first electrode 115 and the second electrode 124 may be formed by a process, such as metallization, screen printing, and high-temperature sintering. Further, after the electrodes are formed, a light annealing treatment is also required, that is, the solar cell sheet is heated at a temperature in a range of 400° C. to 700° C. (for example, 500° C., or 600° C.) for a time in a range of 1 min to 6 min (for example, 2 min, 3 min, 4 min, or 5 min), and then treated simultaneously at a temperature in a range of 150° C. to 400° C. (for example, 200° C., 250° C., 300° C., or 350° C.) and under a light intensity in a range of 1 to 6 solar light intensities (for example, 2, 3, 4, or 5 solar light intensities) for a time in a range of 1 min to 6 min.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A solar cell, comprising:
a substrate, wherein the substrate includes a silicon-based material and has a first surface and a second surface opposite to each other;
a first passivation stack disposed on the first surface and including a first oxygen-rich dielectric layer, a first silicon-rich dielectric layer, a second oxygen-rich dielectric layer, and a second silicon-rich dielectric layer that are sequentially disposed in a direction away from the first surface, wherein the first oxygen-rich dielectric layer includes at least one of aluminum oxide, silicon oxide, silicon oxynitride, gallium oxide, titanium oxide, or hafnium oxide, the first silicon-rich dielectric layer includes a first silicon nitride material, the second oxygen-rich dielectric layer includes at least one of silicon oxide and silicon oxynitride, and the second silicon-rich dielectric layer includes a second silicon nitride material, wherein an atomic fraction of oxygen in the first oxygen-rich dielectric layer is less than an atomic fraction of oxygen in the second oxygen-rich dielectric layer, wherein an atomic fraction of silicon in the first silicon-rich dielectric layer is greater than an atomic fraction of silicon in the second silicon-rich dielectric layer, and the atomic fraction of the oxygen in the second oxygen-rich dielectric layer is greater than the atomic fraction of the silicon in the first silicon-rich dielectric layer;
a tunneling oxide layer disposed on the second surface;
a doped conductive layer disposed on a surface of the tunneling oxide layer; and
a second passivation layer disposed on a surface of the doped conductive layer.

2. The solar cell according to claim 1, wherein the atomic fraction of oxygen in the first oxygen-rich dielectric layer is in a range of 40% to 70%, the first silicon-rich dielectric layer includes oxygen atoms and an atomic fraction of oxygen in the first silicon-rich dielectric layer is greater than 0% and less than or equal to 10%, the atomic fraction of oxygen in the second oxygen-rich dielectric layer is in a range of 50% to 80%, and the second silicon-rich dielectric layer includes oxygen atoms and an atomic fraction of oxygen in the second silicon-rich dielectric layer is greater than 0% and less than or equal to 10%.

3. The solar cell according to claim 2, wherein the atomic fraction of oxygen in the first oxygen-rich dielectric layer is in a range of 40% to 60%, the atomic fraction of oxygen in the first silicon-rich dielectric layer is greater than 0% and less than or equal to 7%, and the atomic fraction of oxygen in the second silicon-rich dielectric layer is greater than 0% and less than or equal to 7%.

4. The solar cell according to claim 1, wherein the atomic fraction of the silicon in the second silicon-rich dielectric layer is in a range of 30% to 60%, and the atomic fraction of the silicon in the first silicon-rich dielectric layer is in a range of 40% to 70%.

5. The solar cell according to claim 1, wherein the first oxygen-rich dielectric layer includes an aluminum oxide layer and a silicon oxynitride layer, and the aluminum oxide layer is positioned between the silicon oxynitride layer and the substrate.

6. The solar cell according to claim 1, wherein a ratio of the number of oxygen atoms to the number of aluminum atoms in the aluminum oxide is in a range of 0.6 to 2.4.

7. The solar cell according to claim 1, wherein a refractive index of the first oxygen-rich dielectric layer is higher than a refractive index of the second oxygen-rich dielectric layer.

8. The solar cell according to claim 1, wherein the first oxygen-rich dielectric layer includes a silicon oxide material, a refractive index of the first oxygen-rich dielectric layer is in a range of 1.58 to 1.61, and a thickness of the first oxygen-rich dielectric layer in a direction perpendicular to the first surface is in a range of 2 nm to 15 nm.

9. The solar cell according to claim 1, wherein the first oxygen-rich dielectric layer includes a silicon oxynitride material, a refractive index of the first oxygen-rich dielectric layer is in a range of 1.61 to 1.71, and a thickness of the first oxygen-rich dielectric layer in a direction perpendicular to the first surface is in a range of 8 nm to 20 nm.

10. The solar cell according to claim 1, wherein the first oxygen-rich dielectric layer includes an aluminum oxide material, a refractive index of the first oxygen-rich dielectric layer is in a range of 1.71 to 1.81, and a thickness of the first oxygen-rich dielectric layer in a direction perpendicular to the first surface is in a range of 1 nm to 20 nm.

11. The solar cell according to claim 1, wherein the second oxygen-rich dielectric layer includes a silicon oxynitride material, a refractive index of the second oxygen-rich dielectric layer is in a range of 1.56 to 1.62, and a thickness of the second oxygen-rich dielectric layer in a direction perpendicular to the first surface is in a range of 5 nm to 20 nm.

12. The solar cell according to claim 1, wherein a refractive index of the first silicon-rich dielectric layer is higher than a refractive index of the second silicon-rich dielectric layer.

13. The solar cell according to claim 12, wherein the refractive index of the first silicon-rich dielectric layer is in a range of 2.02 to 2.2, and the refractive index of the second silicon-rich dielectric layer is in a range of 1.98 to 2.06.

14. The solar cell according to claim 1, wherein a ratio of the number of silicon atoms to the number of nitrogen atoms in the first silicon nitride material is in a range of 0.66 to 2.3.

15. The solar cell according to claim 14, wherein a refractive index of the first silicon-rich dielectric layer is in a range of 2.02 to 2.2, and a thickness of the first silicon-rich dielectric layer in a direction perpendicular to the first surface is in a range of 20 nm to 50 nm.

16. The solar cell according to claim 1, wherein a ratio of the number of silicon atoms to the number of nitrogen atoms in the second silicon nitride material is in a range of 0.46 to 1.87.

17. The solar cell according to claim 16, wherein a refractive index of the second silicon-rich dielectric layer is in a range of 1.98 to 2.06, and a thickness of the second silicon-rich dielectric layer in a direction perpendicular to the first surface is in a range of 20 nm to 50 nm.

18. The solar cell according to claim 1, wherein a refractive index of the second passivation layer is in a range of 2.04 to 2.2, and a thickness of the second passivation layer in a direction perpendicular to the second surface is in a range of 60 nm to 100 nm.

19. A photovoltaic module comprising:
a cell string including a plurality of solar cells connected with each other;
a package adhesive film configured to cover a surface of the cell string;
a cover plate configured to cover a surface of the package adhesive film facing away from the cell string;
wherein the plurality of solar cells includes at least one solar cell of claim 1.

20. The solar cell according to claim 1, wherein the atomic fraction of the oxygen in the first oxygen-rich dielectric layer is greater than an atomic fraction of oxygen in the first silicon-rich dielectric layer and greater than an atomic fraction of oxygen in the second silicon-rich dielectric layer.

\* \* \* \* \*